(12) United States Patent
LeBonheur et al.

(10) Patent No.: US 6,975,025 B2
(45) Date of Patent: Dec. 13, 2005

(54) SEMICONDUCTOR CHIP PACKAGE AND METHOD OF MANUFACTURING SAME

(75) Inventors: Vassoudevane LeBonheur, Tempe, AZ (US); Debendra Mallik, Chandler, AZ (US); Eduardo J. Bolanos, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 388 days.

(21) Appl. No.: 09/999,169

(22) Filed: Dec. 3, 2001

(65) Prior Publication Data

US 2003/0104652 A1 Jun. 5, 2003

(51) Int. Cl.⁷ .............................................. H01L 23/053
(52) U.S. Cl. ........................ 257/700; 257/707; 257/777
(58) Field of Search .................................. 257/700, 707, 257/777

(56) References Cited

U.S. PATENT DOCUMENTS

| | | | | |
|---|---|---|---|---|
| 5,621,615 A | * | 4/1997 | Dawson et al. | 361/704 |
| 5,909,056 A | * | 6/1999 | Mertol | 257/704 |
| 5,994,766 A | * | 11/1999 | Shenoy et al. | 257/659 |
| 6,002,171 A | * | 12/1999 | Desai et al. | 257/707 |
| 6,048,483 A | * | 4/2000 | Miyajima | 264/272.14 |
| 6,077,724 A | * | 6/2000 | Chen | 438/107 |
| 6,081,037 A | * | 6/2000 | Lee et al. | 257/778 |
| 6,093,970 A | * | 7/2000 | Ohsawa et al. | 257/777 |
| 6,137,167 A | * | 10/2000 | Ahn et al. | 257/691 |
| 6,166,434 A | * | 12/2000 | Desai et al. | 257/704 |
| 6,198,635 B1 | * | 3/2001 | Shenoy et al. | 361/760 |
| 6,229,217 B1 | * | 5/2001 | Fukui et al. | 257/777 |
| 6,292,369 B1 | * | 9/2001 | Daves et al. | 361/719 |
| 6,297,550 B1 | * | 10/2001 | Chia et al. | 257/707 |
| 6,404,648 B1 | * | 6/2002 | Slupe et al. | 361/760 |
| 6,441,495 B1 | * | 8/2002 | Oka et al. | 257/777 |
| 6,472,762 B1 | * | 10/2002 | Kutlu | 257/778 |
| 6,486,562 B1 | * | 11/2002 | Kato | 257/778 |
| 6,504,243 B1 | * | 1/2003 | Andric et al. | 257/718 |
| 6,607,942 B1 | * | 8/2003 | Tsao et al. | 438/122 |
| 6,731,010 B2 | * | 5/2004 | Horiuchi et al. | 257/777 |
| 2002/0163075 A1 | * | 11/2002 | Ho et al. | 257/712 |
| 2002/0185744 A1 | * | 12/2002 | Katagiri et al. | 257/777 |
| 2003/0006496 A1 | * | 1/2003 | Vaiyapuri | 257/686 |
| 2003/0111737 A1 | * | 6/2003 | Katagiri et al. | 257/777 |

* cited by examiner

*Primary Examiner*—David E. Graybill
(74) *Attorney, Agent, or Firm*—Blakely, Sokoloff, Taylor and Zafman

(57) ABSTRACT

A semiconductor chip package, an electronic system, and a method of manufacturing such package. A lower structure includes a lower insulating layer and a metal layer made of separate electrical conductors. A wall defines a cavity on the metal layer. Electrical conductors extend from the metal layer to contact points elsewhere in the semiconductor chip package. Conductor members are positioned on the electrical conductors of the metal layer. A semiconductor chip is positioned on the conductor members within the cavity, with an isolation area between the semiconductor chip and the wall. The electrical contacts on the semiconductor chip contact the conductor members to couple the semiconductor chip to the contact points. Underfill material is provided within the isolation area between the perimeter surface and the wall, and is prevented by the wall from spreading to other areas. Placement of the semiconductor chip within the cavity reduces the package thickness.

27 Claims, 4 Drawing Sheets

SEMICONDUCTOR CHIP PACKAGE AND METHOD OF MANUFACTURING SAME

FIELD

The present invention is directed to a semiconductor chip package and to a method of manufacturing a semiconductor chip package.

BACKGROUND

Semiconductor chips available today include chips having a bottom surface with electrical contacts permitting connection of components within the semiconductor chip to other devices. Such semiconductor chips are widely referred to as "flip chips." These semiconductor chips are frequently packaged on a substrate which has electrical conductors on one surface and contact points elsewhere in the semiconductor chip package, for example extending from a lower surface. Other electrical conductors orvias extend from the surface electrical conductor to the contact points. Conductor members, such as solder spheres or balls are positioned on the surface electrical conductors, and the semiconductor chip is positioned on the conductor members, electrically coupling the components within the semiconductor chip to the contact points of the semiconductor chip package. An underfill material, such as an epoxy, is applied around the perimeter of the semiconductor chip, and frequently also beneath the semiconductor chip, to enclose and isolate its electrical contacts and the conductor members. A second semiconductor chip might be mounted on top of the first semiconductor chip, for example being attached with an epoxy die attach material. The second semiconductor chip is connected by a number of electrical conductors, for example in the form of wires, to bonding pads in the substrate. The wires are connected to these wire bonding pads through small openings in the top insulation layer of the substrate. However, only a small amount of the underfill material is required, and it is extremely difficult to control the quantity applied and to limit the underfill to the desired area on the substrate. As a consequence, frequently access to the wire bonding pads on the substrate is wholly or partially blocked by the underfill material, making it impossible to attach the wires from the second semiconductor chip. This problem is particularly acute considering the small size of semiconductor chip. Frequently, the openings providing access to the wire bonding pads are within less than two millimeters of the edge of the first semiconductor chip, necessitating the accurate application of a very narrow band of the underfill material. The underfill material is generally applied from a nozzle-like source positioned adjacent one edge of the substrate. This often results in a projection or tongue of underfill material extending from the semiconductor chip to the edge of the substrate and blocking access to one or more of the wire bonding pads. A semiconductor chip package with such a defect is unusable. Further, semiconductor chip packages are frequently manufactured in a matrix array, permitting production of, for example, six semiconductor chip packages at a time. An underfill tongue might extend so far as to contact an adjacent semiconductor chip package, making that package unusable also.

A further shortcoming is that the semiconductor chip package is undesirably thick, particularly when it includes two semiconductor chips. This is especially disadvantageous in semiconductor chip packages for use in small consumer electronic products such as cell phones and other hand held wireless devices.

BRIEF DESCRIPTION OF THE DRAWINGS

The foregoing and a better understanding of the present invention will become apparent from the following detailed description of example embodiments and the claims, particularly when read in conjunction with the accompanying drawings, all forming a part of the disclosure of this invention. While the foregoing and following written and illustrated disclosure focus on disclosing example embodiments of the invention, it should be clearly understood that this is by way of illustration and example only and that the invention is not limited thereto. In the drawings:

DETAILED DESCRIPTION

Figure 1:
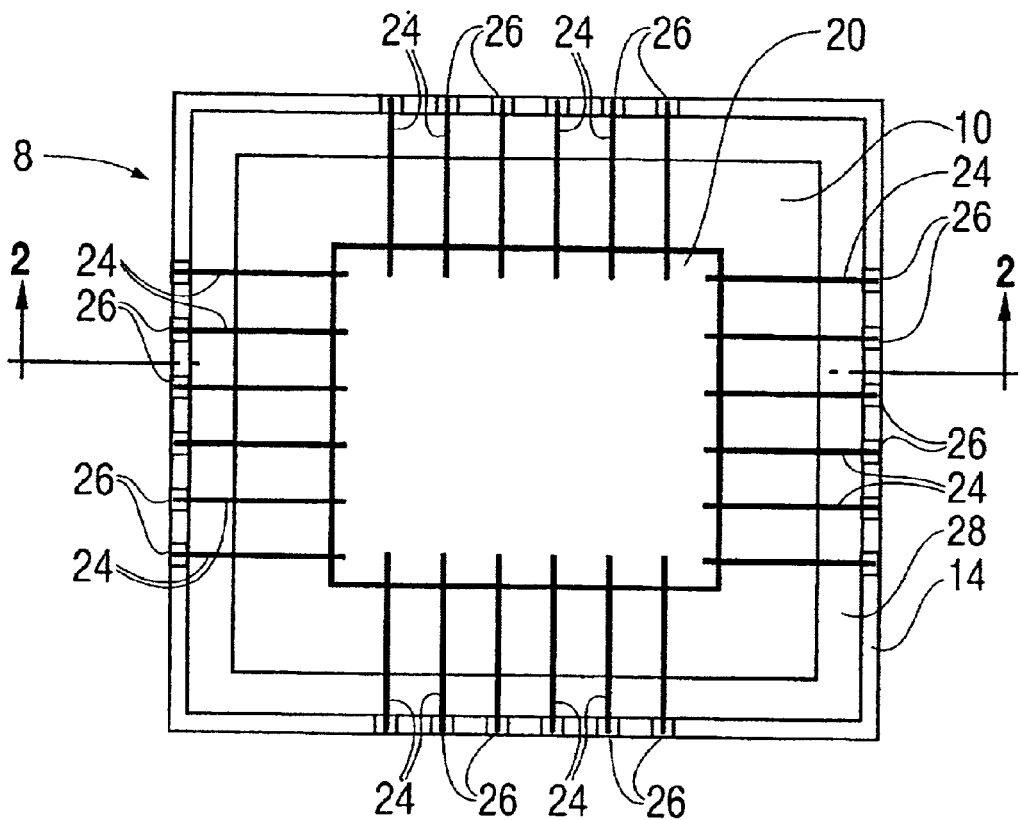
FIG. 1 is a top plan view of an example background arrangement useful in gaining a more thorough understanding of the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same. Where specific details are set forth in order to describe example embodiments of the invention, it should be apparent to one skilled in the art that the invention can be practiced without, or with variation of, these specific details.

Figure 2:
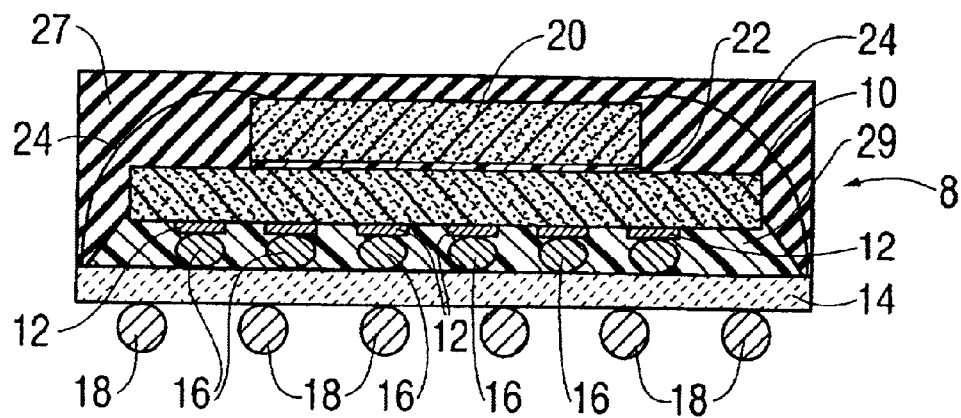
FIG. 2 is a cross-sectional view taken along line 2—2 of FIG. 1.

FIGS. 1 and 2 depict an example background arrangement useful in gaining a more thorough understanding of the present invention. A semiconductor chip package 8 includes a semiconductor chip 10 having a number of electrical contacts 12 on its lower surface. Semiconductor chip 10 is positioned on a substrate 14. Substrate 14 has electrical conductors (not shown) within it, extending from first contact points on its upper surface to second contact points elsewhere, such as conductor members 18 on its lower surface. A number of conductor members 16, for example on the form of solder spheres or balls, couple the electrical contacts 12 on semiconductor chip 10 to the contact points on the uppersurface of substrate 14, providing electrical connections from components within semiconductor chip 10 to conductor members 18.

A second semiconductor chip 20 might be positioned on the upper surface of semiconductor chip 10, for example being affixed by an epoxy or other suitable die attach adhesive 22. A number of electrical connectors, 24, for example wires, extend from second semiconductor chip 20 to wire bonding pads 26 on substrate 14, adjacent the perimeter of the substrate. Although not so illustrated in FIG. 1, wire bonding pads 26 are typically on a metal layer of substrate 14, beneath a top insulating layer of the substrate and are accessible through small openings in the insulating layer. To electrically insulate and isolate the electrical contacts 12 and conductor members 16, an underfill material 29 is applied. The area above underfill material 29, semiconductor chip 10, and second semiconductor chip 20, if present, including electrical connectors 24, is often covered by a molding compound 27 to insulate and protect the semiconductor chip package.

As can be seen from FIG. 1, the area to which the underfill material 29 is to be applied is limited by the perimeter surface of semiconductor chip 10 and the edge area of substrate 14 on which wire pads 26 are positioned. Typically, this area might have width of two millimeters or less. Often the underfill material extends onto one or more of the wire bonding pads 26, as shown in area 25, making it impossible to connect the corresponding wires 24. Such a semiconductor chip package must be discarded.

Figure 3:
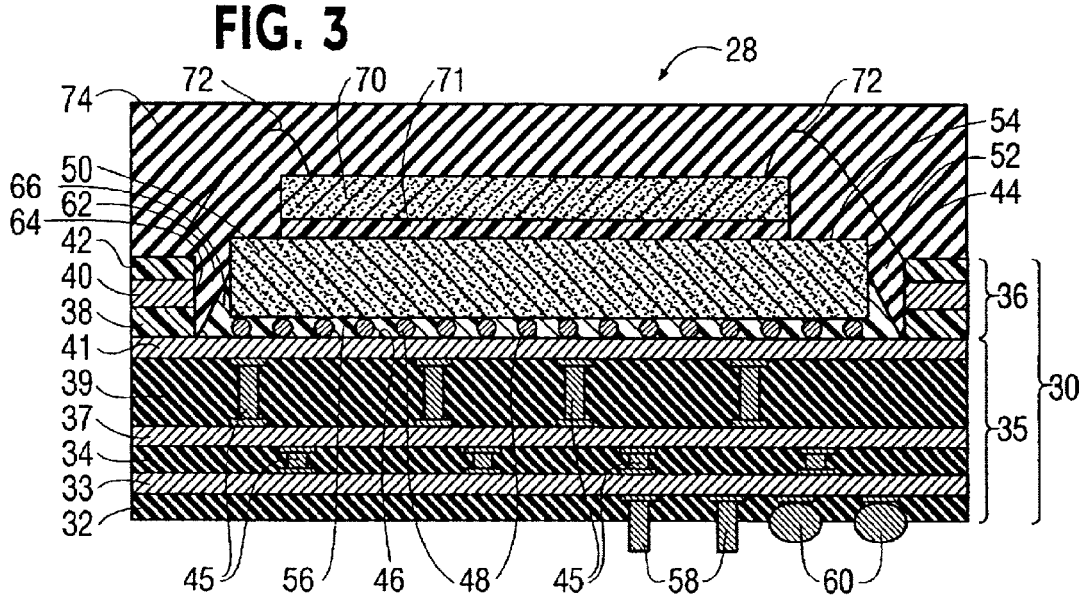
FIG. 3 is a cross-sectional view of an example embodiment of the present invention.
Figure 4:
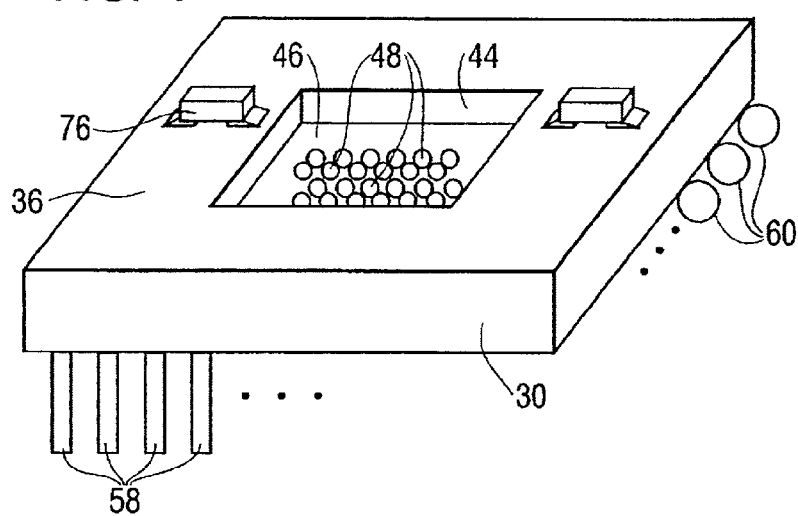
FIG. 4 is as perspective view of a portion of the example embodiment of FIG. 3.
Figure 5:
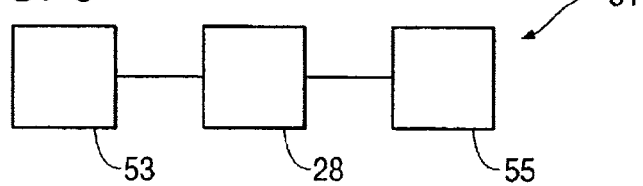
FIG. 5 is a block diagram of an electronics system including the semiconductor chip package of FIG. 3.
Figure 8:
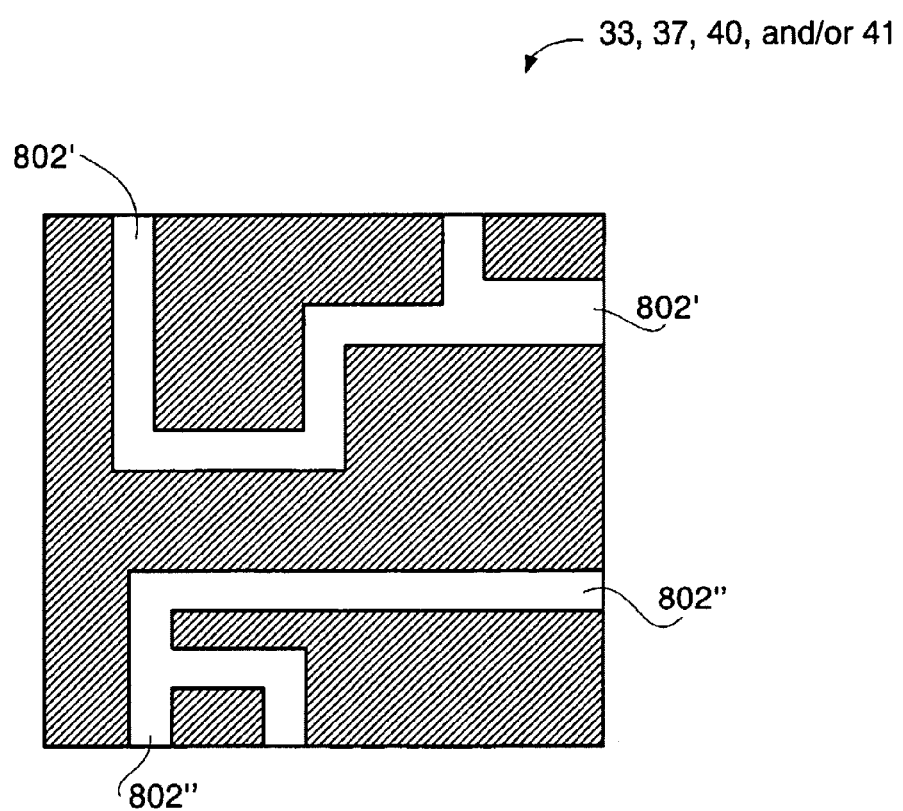
FIG. 8 is a top view depicting an example embodiment of metal layers.

FIG. 3 is a cross sectional view depicting an example embodiment of a semiconductor chip package 28 in accordance with the present invention, and FIG. 4 is a perspective view of a portion of that embodiment. In the illustrative example of FIGS. 3 and 4, substrate 30 includes a lower structure 35 and a wall 36. Lower structure 35 is formed of an alternating sequence of a plurality of insulating layers and a plurality of electrically conductive layers, and is depicted as including a first insulating layer 32, such as a solder mask, a first metal layer 33, a second insulating layer 34, a second metal layer 37, a support layer 39 of an insulating material such as bismaleimide triazine (BT) core material, and a third metal layer 41. Wall 36 extends around the periphery of the lower structure 35 and includes a further insulating layer 38, a further metal layer 40, and a top insulating layer 42. A cavity 44 is defined within wall 36. The upper surface of third metal layer 41, within wall 36, forms a contact area 46. A number of electrical conductors or vias 45 extend between first metal layer 33 and second metal layer 37, between second metal layer 37 and third metal layer 41, and between third metal layer 41 and further metal layer 40. A number of conductor members such as connector pins 58 or connector balls 60 contact the lower surface of first metal layer 33 and extend through first insulating layer 32 to permit connection to other components of a system into which semiconductor chip package 28 might be incorporated. For example, FIGS. 5 depicts an electronics system 51 including semiconductor chip package 28 connected to other circuitry 53 and 55. If desired, lower structure 35 can include more or fewer layers. By way of example, insulating layer 38 and metal layer 40 can be a part of lower structure 35, extending over the entire surface of metal layer 41, with contact area 46 formed on metal layer 40, and with wall 36 formed only by insulating layer 42. As seen in FIG. 8. a top view depicting an example embodiment of one of metal layers 33, 37, 40, and/or 41, metal layers 33, 37, 40 and 41 are not continuous sheets, but instead each metal layer is formed of a number of discrete electrical conductors (such as conductors 802' and 802") to carry power and signals of various types between discrete points of the semiconductor chip package, such as between selected ones of conductor members 48 and vias 45, between different vias, and between selected vias 45 and connector pins 58 or connector balls 60.

Semiconductor chip 50 includes a number of electrical components, as is well known. Semiconductor chip 50 has a perimeter surface 52, an upper surface 54, and a lower surface 56. Lower surface 56 has a number of electrical contacts (not shown) on it which are connected to the various components within the semiconductor chip. A number of conductor members 48 are connected to selected ones of these electrical contacts. Semiconductor chip 50 is then positioned in contact area 46 with individual ones of the electrical contacts on semiconductor chip 50 contacting respective ones of the conductor members 48 to electrically couple components of the semiconductor chip to contact points elsewhere in semiconductor chip package 28 and to connector pins 58 and connector balls 60.

Semiconductor chip 50 is positioned in cavity 44 in a manner leaving an isolation area 62 around the semiconductor chip, between the perimeter surface 52 of the chip and the side surface 64 of wall 36. An underfill material 66, for example an epoxy material, is applied to the edge of chip 50 within isolation area 62, for example extending from a point substantially midway up perimeter surface 52 of semiconductor chip 50 to a point adjacent the junction of the upper surface of third metal layer 41 and side surface 64 of wall 36. Preferably, also, underfill material 66 extends throughout contact area 46 beneath semiconductor chip 50 so as to enclose and isolate conductor members 48 and the electrical contacts on the lower surface of semiconductor chip 50. Underfill material 66 thus assures not only that the conductor members and contacts are insulated, but also that foreign matter and moisture cannot get into contact area 46. Isolation area 62 retains the underfill material 66 within cavity 44, assuring that the underfill material does not inadvertently spread onto the upper surface of wall 36 or onto an adjacent semiconductor chip package.

If desired, a second semiconductor chip 70 can be positioned on the upper surface 54 of first semiconductor chip 50, for example, being affixed on surface 54 by a suitable die attach adhesive 71 such as an epoxy. Circuitry within second semiconductor chip 70 is then connected by suitable electrical conductors 72, such as wires, to wire bonding pads on further metal layer 40 of wall 36, passing through top insulating layer 42. Alternatively, electrical conductors 72 might connect to contact points in lower structure 35. In the example embodiment depicted in FIG. 3, the entire semiconductor chip package is then covered over by a suitable insulating and protective material 74, such as a molding compound.

If desired, electrical components 76, such as capacitors, can be supported on the upper surface of wall 36 as illustrated in FIG. 4. These components might be connected by means of electrical conductors 45 within substrate 30 to other components of the semiconductor chip package or to connector pins 58 or connector balls 60.

Figure 6:
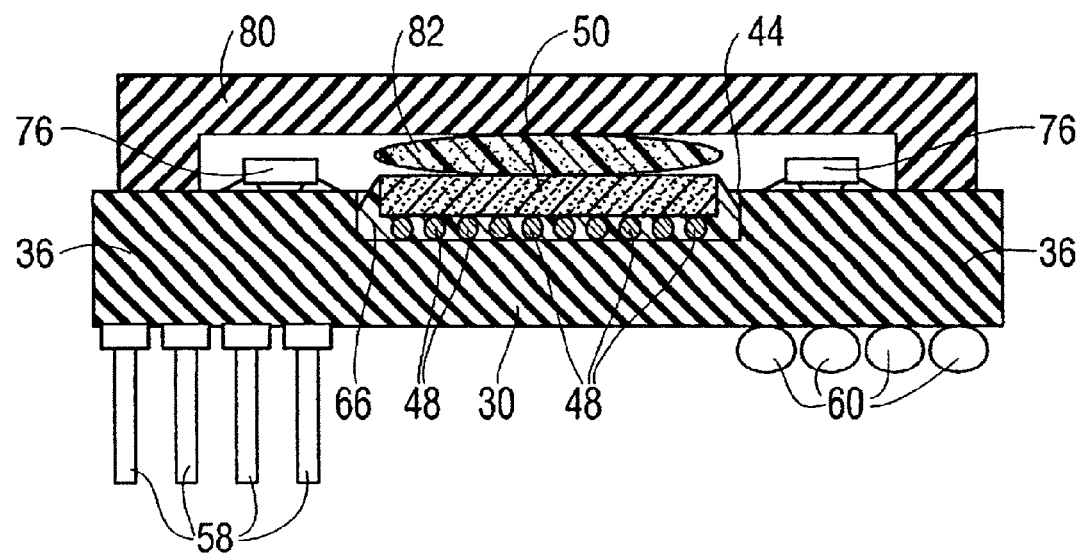
FIG. 6 is a cross-sectional view of another example embodiment of a semiconductor chip package in accordance with the present invention.

FIG. 6 depicts another example embodiment of a semiconductor chip package in accordance with the present invention, A single semiconductor chip 50 is positioned within cavity 44 in substrate 30. Underfill material 66 insulates and isolates conductor members 48. Electrical components 76 might be positioned on the upper surface of wall 36. A heat spreader 80 is mounted on the upper surface of wall 36 to cover cavity 44 and all of the components therein. In addition, a thermal interface material 82 which has a high coefficient of heat transfer, such as a metal filled epoxy or a grease material, connects the upper surface of semiconductor chip 50 with the interior surface of heat spreader 80. Heat spreader 80 thus helps to more rapidly dissipate heat generated by semiconductor chip 50.

The placement of semiconductor chip 50 within cavity 44 in accordance with the present invention results in a shorter, more compact semiconductor chip package, reducing the package thickness from that of semiconductor chip package 8 of FIGS. 1 and 2.

In an example embodiment of a method of manufacturing semiconductor chip packages in accordance with the present invention, substrate 30 is formed with wall 36 extending from lower structure 35 to surround cavity 44. Wall 36 might be formed by first forming the substrate with layers 38, 40, and 42 extending over the entire substrate surface, and then removing the portion of those layers within the area of cavity 44, leaving wall 36 on lower structure 35. Alternatively, substrate 30 might be formed by first forming lower structure 35 and then adding wall 36 around the perimeter of the lower structure. Conductor members 48 are connected to electrical contacts on the lower surface of semiconductor chip 50, and chip 50 is positioned within contact area 46 with conductor members 48 contacting electrical conductors 45, so as to provide an electrical path from electrical components within chip 50 to contact points elsewhere in the semiconductor chip package, including connector pins 58 or connector balls 60. The semiconductor chip is positioned within cavity 44 with isolation area 62 around the semiconductor chip, between perimeter surface 52 of the chip and side surface 64 of wall 36. Underfill material 66 is then applied around semiconductor chip 50, enclosing and isolating contact area 46 beneath semiconductor chip 50. If desired, the underfill material is also applied within contact area 46, beneath semiconductor chip 50, so as to surround the electrical conductors 48. Likewise, if desired, second semiconductor chip 70 is affixed to the upper surface 54 of first semiconductor chip 50 with an appropriate adhesive 71. Electrical conductors such as wires 72 are connected from second semiconductor chip 70 to wire bonding pads on further metal layer 40. Alternatively, second semiconductor chip 70, adhesive 71, electrical conductors 72, and the wire bonding pads can be omitted. In such case, further metal layer 40 and top insulating layer 42 might still be included or might also be omitted. A suitable molding compound 74 or a thermal interface material 82 and heat spreader 80 may then be applied.

Figure 7:
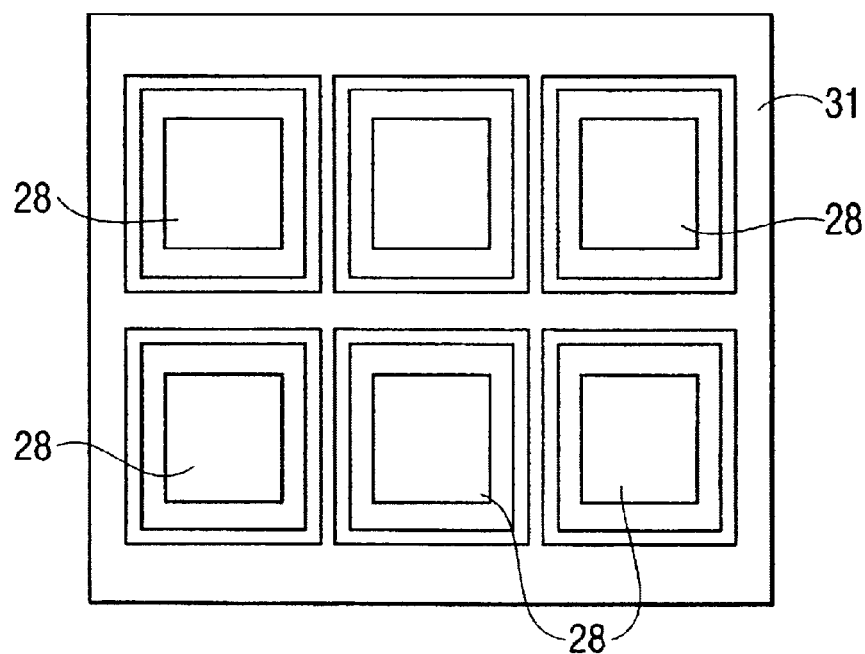
FIG. 7 is a top plan view of an array of semiconductor chip packages, illustrating an example embodiment of a method of manufacturing semiconductor chip packages in accordance with the present invention.

As depicted in FIG. 7, an array of semiconductor chip packages 28 can be manufactured in a molded matrix array type of package (MMAP), for example by a molding process. Support surface 31 might simply be an extension of top insulation layer 42, for example. After manufacture, substrate 30 is cut to provide the separate semiconductor chips.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative order, simultaneously, etc.

This concludes the description of the example embodiments. Although the present invention has been described with reference to a number of illustrative embodiments thereof, it should be understood that numerous other modifications and embodiments can be devised by those skilled in the art and will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A semiconductor chip package, comprising:
   a lower structure having an upper surface;
   a wall extending from the lower structure upper surface to define a cavity within the wall, the cavity having a contact area on the upper surface of the lower structure, the wall including a first insulating layer on the lower structure upper surface, a metal layer on the first insulating layer, and a second insulating layer on the metal layer;
   a plurality of electrical conductors extending from the contact area to contact points elsewhere in the semiconductor chip package;
   a first semiconductor chip positioned on the contact area, the first semiconductor chip including a plurality of components and having a perimeter surface and a lower surface, the lower surface having a plurality of electrical contacts thereon connecting to the components, the first semiconductor chip being positioned within the cavity with an isolation area therearound between the perimeter surface and the wall and with individual ones of the electrical contacts coupled to respective ones of the plurality of electrical conductors; and
   an electrically non-conducting underfill material within the isolation area to enclose and isolate the cavity contact area.

2. A semiconductor chip package as claimed in claim 1, further comprising a plurality of conductor members on the contact area, coupling electrical contents of the semiconductor chip to the electrical conductors.

3. A semiconductor chip package as claimed in claim 1, wherein the package further comprises a second semiconductor chip positioned above the first semiconductor chip, the second semiconductor chip including a second plurality of components and a surface with a second plurality of electrical contacts connected to the second semiconductor chip components; and a second plurality of electrical conductors connecting the second plurality of electrical contacts to the wall.

4. A semiconductor chip package as claimed in claim 1, wherein the semiconductor package further comprises a plurality of conductor members electrically coupled to the at least some of the plurality of electrical conductors and extending through the lower insulating layer.

5. A semiconductor chip package as claimed in claim 4, wherein the plurality of conductor members comprise connector pins.

6. A semiconductor chip package as claimed in claim 4, wherein the plurality of conductor members comprise connector balls.

7. A semiconductor chip package as claimed in claim 1, further comprising a heat spreader connected to the wall to cover the substrate cavity, the heat spreader being in thermal contact with the first semiconductor chip to dissipate heat from the semiconductor chip.

8. A semiconductor chip package as claimed in claim 7, further comprising thermal interface material supported on the first semiconductor chip and contacting the heat spreader, to conduct heat generated by the semiconductor chip to the heat spreader.

9. A semiconductor chip package as claimed in claim 1, wherein the underfill material extends within the contact area beneath the first semiconductor chip to enclose and isolate the electrical contacts and the first conductor members.

10. A semiconductor chip package as claimed in claim 1, wherein the lower structure comprises an alternating sequence of a plurality of insulating layers and a plurality of metal layers.

11. A semiconductor chip package as claimed in claim 10, wherein at least some of the metal layers are made up of a further plurality of electrical conductors.

12. A semiconductor chip package as claimed in claim 1, wherein the wall has an upper surface, and wherein the package further comprises electrical components on the wall upper surface.

13. An electronic system, comprising a first electronic circuitry; a second electronic circuitry; and a semiconductor chip package having a first conductor member of a first plurality of conductor members connected to the first electronic circuitry and a second conductor member of the first plurality of conductor members connected to the second electronic circuitry, the semiconductor chip package comprising:

a lower structure having an upper surface;
a wall extending from the lower structure upper surface to define a cavity within the wall, the cavity having a contact area on the upper surface of the lower structure;
a plurality of electrical conductors extending from the contact area to the semiconductor chip package conductor members;
a first semiconductor chip positioned on the contact area, the first semiconductor chip including a plurality of components and having a perimeter surface and a lower surface, the lower surface having a plurality of electrical contacts thereon connecting to the components, the first semiconductor chip being positioned within the cavity with an isolation area therearound between the perimeter surface and the wall and with individual ones of the electrical contacts coupled to respective ones of the electrical conductors; and
an electrically non-conducting underfill material within the isolation area to enclose and isolate the cavity contact area.

14. A semiconductor chip package as claimed in claim 13, further comprising a second plurality of conductor members on the contact area, coupling electrical contacts of the semiconductor chip to the electrical conductors.

15. An electronic system as claimed in claim 13, wherein the package further comprises a second semiconductor chip positioned above the first semiconductor chip, the second semiconductor chip including a second plurality of components and a surface with a second plurality of electrical contacts connected to the second semiconductor chip components; and a second plurality of electrical conductors connecting the second plurality of electrical contacts to the wall.

16. An electronic system as claimed in claim 13, wherein at least some of the first plurality of conductor members extend through the lower insulating layer.

17. An electronic system as claimed in claim 16, wherein the plurality of conductor members comprise connector pins.

18. An electronic system as claimed in claim 16, wherein the plurality of conductor members comprise connector balls.

19. An electronic system as claimed in claim 13, further comprising a heat spreader connected to the wall to cover the substrate cavity, the heat spreader being in thermal contact with the first semiconductor chip to dissipate heat from the semiconductor chip.

20. An electronic system as claimed in claim 19, further comprising thermal interface material supported on the first semiconductor chip and contacting the heat spreader, to conduct heat generated by the semiconductor chip to the heat spreader.

21. An electronic system as claimed in claim 14, wherein the underfill material extends within the contact area beneath the first semiconductor chip to enclose and isolate the electrical contacts and at least some of the second plurality of conductor members.

22. An electronic system as claimed in claim 13, wherein the lower structure comprises an alternating sequence of a plurality of insulating layers and a plurality of metal layers.

23. A semiconductor chip package as claimed in claim 22 wherein at least some of the metal layers are made up of a further plurality of electrical conductors.

24. An electronic system as claimed in claim 23, wherein the wall has an upper surface, and wherein the package further comprises electrical components on the wall upper surface.

25. A semiconductor chip package as claimed in claim 1, wherein the wall has an upper surface, and wherein the package further comprises a capacitor on the wall upper surface.

26. A semiconductor chip package as claimed in claim 13, wherein the wall has an upper surface, and wherein the package further comprises a capacitor on the wall upper surface.

27. A semiconductor chip package as claimed in claim 13, wherein the wall comprises a first insulating layer on the lower structure upper surface, a metal layer on the first insulating layer, and a second insulating layer on the metal layer.

* * * * *